(12) United States Patent
Konijn et al.

(10) Patent No.: US 9,081,070 B2
(45) Date of Patent: Jul. 14, 2015

(54) TESSERAL SHIM COIL FOR A MAGNETIC RESONANCE SYSTEM

(75) Inventors: Jan Konijn, Den Bosch (NL); Gerardus Bernardus Jozef Mulder, Best (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 842 days.

(21) Appl. No.: 13/203,499

(22) PCT Filed: Mar. 18, 2010

(86) PCT No.: PCT/IB2010/051170
§ 371 (c)(1),
(2), (4) Date: Jan. 10, 2012

(87) PCT Pub. No.: WO2010/106513
PCT Pub. Date: Sep. 23, 2010

(65) Prior Publication Data
US 2012/0098541 A1    Apr. 26, 2012

(30) Foreign Application Priority Data

Mar. 20, 2009  (EP) ..................................... 09155782

(51) Int. Cl.
G01R 33/341    (2006.01)
H01F 5/00       (2006.01)
G01R 33/3875   (2006.01)

(52) U.S. Cl.
CPC ................................. G01R 33/3875 (2013.01)

(58) Field of Classification Search
CPC ......................... G01R 33/3875; G01R 33/3873
USPC .................................. 324/318, 322; 335/299
See application file for complete search history.

(56) References Cited

U.S. PATENT DOCUMENTS

| 3,569,823 | A | 3/1971 | Golay |
| 4,509,030 | A | 4/1985 | Vermilyea |
| 4,680,551 | A | 7/1987 | O'Donnell et al. |
| 4,949,043 | A | 8/1990 | Hillenbrand et al. |
| 5,650,724 | A | 7/1997 | Yamagata |
| 5,661,401 | A | 8/1997 | Ishikawa et al. |
| 5,773,976 | A | 6/1998 | Sakakura et al. |

(Continued)

FOREIGN PATENT DOCUMENTS

| EP | 0236789 A1 | 2/1987 |
| JP | 08332175 A | 12/1996 |
| WO | 9842256 A1 | 10/1998 |

OTHER PUBLICATIONS

Hughes, D. G., et al.; Compact, Cylindrical, Distributed-Current, Transverse-Gradient Coils for Use in MRI; 1996; Journal of Magnetic Resonance; 110(2)158-163.

(Continued)

*Primary Examiner* — Melissa Koval
*Assistant Examiner* — Rishi Patel

(57) ABSTRACT

A tesseral shim coil for shimming the magnetic field of a magnetic resonance system by generating the spherical harmonics of the sine and cosine type of the magnetic field, the tesseral shim coil comprising at least four saddle coils, wherein the sum of the azimuthal span of the at least four saddle coils is less than 360 degrees. First and second sets of shim coils, respectively generating sine and cosine components of the shim fields are combined into a single coil layer, thereby reducing the radial thickness of the shim coil assembly.

20 Claims, 8 Drawing Sheets

(56) References Cited

U.S. PATENT DOCUMENTS

| | | | |
|---|---|---|---|
| 5,910,728 A * | 6/1999 | Sodickson | 324/309 |
| 6,583,696 B1 * | 6/2003 | Datsikas | 335/301 |
| 7,148,690 B2 | 12/2006 | Hollis | |
| 7,427,908 B1 | 9/2008 | Painter et al. | |
| 2005/0110492 A1 | 5/2005 | Watkins et al. | |
| 2007/0030004 A1 | 2/2007 | Amor et al. | |
| 2007/0241755 A1 * | 10/2007 | Ikedo | 324/320 |
| 2008/0204026 A1 * | 8/2008 | Tsuchiya et al. | 324/321 |

OTHER PUBLICATIONS

Painter, T. A., et al.; Resistive Shims for High-Field Resistive and Hybrid Magnets; 2008; IEEE Trans. on Applied Superconductivity; 18(2)579-582.

Romeo, F., et al.; Magnet Field Profiling: Analysis and correcting Coil Design; 1984; Magnetic Resonance in Medicine; 1(1)44-65.

* cited by examiner

TESSERAL SHIM COIL FOR A MAGNETIC RESONANCE SYSTEM

FIELD OF THE INVENTION

The invention relates to the design of tesseral shimming coils for magnetic resonance imaging systems.

BACKGROUND OF THE INVENTION

A static magnetic field is used by Magnetic Resonance Imaging (MRI) scanners to align the nuclear spins of atoms as part of the procedure for producing images within the body of a patient. This static magnetic field is referred to as the $B_0$ field. It is commonly known that increasing the homogeneity of the $B_0$ field used for performing an MRI scan increases the quality of the diagnostic images, which benefits physicians using an MRI image to diagnose a patient.

To increase the homogeneity of the $B_0$ the field in the imaging zone or region where the magnetic resonance imaging data is acquired is decomposed into spherical harmonics. The majority of magnetic resonance imaging systems have cylindrical symmetry, but the spherical harmonics have a closed form. Individual coils are designed to adjust or shim a single spherical harmonic of the $B_0$ field. The first order components of the spherical harmonics are typically shimmed using the magnetic field gradient coils and the higher order terms are shimmed using dedicated shimming coils. The magnetic field gradient coils create gradients in the magnetic field in order to spatially encode the radio frequency signals that the nuclei emit during magnetic resonance imaging.

The shimming coils in magnetic resonance imaging systems occupy the high magnetic field region which is adapted for receiving a subject. For example, magnetic resonance imaging magnets with a cylindrical geometry are placed within the bore of the magnet, and each shim coil occupies an individual layer. As a result the shim coils reduce the useable portion of the magnet.

U.S. Pat. No. 7,427,908 B1 discloses the combination of the corrective functionality of the standard X and ZX shim coils into two standard, simplified electrical circuits and conductors. U.S. Pat. No. 7,427,908 B1 also discloses a similar combination of the Y and ZY shimming coils. Coils in these arrangements overlap orthogonally, which allows a reduction in the radial space needed for shimming.

SUMMARY OF THE INVENTION

Embodiments of the invention provide for a tesseral shim coil, a shim coil assembly, a magnetic field shimming system, and a magnetic resonance imaging system in the independent claims. Embodiments of the invention are described in the dependent claims.

Embodiments of the invention reduce the volume required to contain the shimming coils by limiting the azimuthal span of the individual saddle coils. This allows tesseral shim coils that shim spherical harmonics the same degree and order to be combined together in the same layer resulting in a significant radial savings that increases the useable portion of a magnetic resonance imaging magnet. A tesseral shim coil is defined herein as a shim coil for shimming the tesseral or sectoral spherical harmonic components of the $B_0$ field. Although the name is tesseral, sectoral spherical harmonics are also included as the term tesseral shim coil is also used in the art to describe coils which shim the sectoral components of the $B_0$ field.

In magnetic resonance imaging systems, so called electric higher order shim coils are often used to improve the homogeneity of the main magnetic field. They are either used to compensate for the susceptibility artifacts caused by the patient, or to compensate for inhomogeneity of the magnet. In the former case, an optimization procedure is often performed just before or during a scan to determine optimal input currents.

The expression "higher order" refers to the spherical harmonic decomposition of the field with its associated Legendre polynomials:

$$B_z(r, \vartheta, \varphi) = B_z \sum_{n=0}^{\infty} \left\{\frac{r}{r0}\right\}^n \sum_{m=0}^{n} P_{nm}(\cos\vartheta) * \{C_{nm}\cos(m\varphi) + S_{nm}\sin(m\varphi)\}. \quad (1)$$

Shim coils are constructed to shim the $C_{nm}$ and $S_{nm}$ components. For example C21, refers to the $C_{nm}$ component with n=2 and m=1 of equation 1. The degree of the spherical harmonic is specified by n and the order of the spherical harmonic is specified by m. The terminology used in specifying gradient and shim coils is different. The term order typically refers to the degree of the Legendre polynomial that is shimmed. For example, the magnetic field gradient coils are typically considered to perform first order shimming of the B0 field and can be used to shim the C10, C11, S11 terms (plus contaminants). The shim coils are considered to be second order and typically shim the terms: C20, C21, S21, C22, and S22 (plus contaminants). Shim coils which shim spherical harmonics for n greater than or equal to 3 can also be constructed. Ideally, gradient and shim coils would only affect a single spherical harmonic term. The contaminants are the spherical harmonic terms that are unintentionally affected by coil.

For cylindrically symmetric magnets discussed here it is assumed that the Z axis is the axis of symmetry of the cylindrical magnet. The polar angle of the spherical coordinates is also assumed to be measured from the Z axis.

Shim coils are located somewhere within the magnet: either outside the gradient coil, or inside, or internal in the gradient coil. They can be integrated with the gradient coil, RF coil, or mounted on a separate carrier. In the case of a cylindrical magnet, the shim coils are mounted in a cylindrical carrier.

The shim coils occupy very expensive space between the inside of the magnet and the outside of the space adapted to receive a subject. Even a small space savings can be quite substantial. Even when the shim coils are built between primary and shield coils of the gradient coil they consume space, since this region is used up by electrical connections, water cooling, and passive iron shims.

Embodiments of the invention may have the benefit of reducing the radial space that is needed for cylindrical shim coils, and therefore can reduce cost a magnetic resonance imaging system. Additionally, embodiments may also reduce the cost of the shim coils themselves by using less copper, less conductor layers, and fewer insulation layers.

The invention is to build more than one shim channel into one layer.

Normally, one shim "channel," one complete coil electrically connected to its own separate power supply, occupies its own layer. In cylindrical magnetic resonance imaging magnets each channel occupies its own cylindrical layers layer since the saddle or fingerprint shaped "subcoils" cover most of the space in azimuthal direction. A saddle coil is defined herein as a coil which has individual windings that are saddle shaped. The windings of a saddle coil can be rectangular, rectangular with rounded corners, or they can be oval shaped.

Reducing the azimuthal angle of the separate saddle coils allows for interleaving two (or more) shim channels, joining them into one layer, and without significant loss of field quality. This combination of two or more shim channels can lead to a reduced sensitivity of the shim coils; this can be compensated for by driving a higher current through the coil.

Embodiments of the invention provide for a tesseral shim coil for shimming the magnetic field of a magnetic resonance system by generating the spherical harmonics of the sine and cosine type of the magnetic field. The tesseral shim coils comprise at least four saddle coils. The sum of the azimuthal span of the at least four saddle coils is less than 360 degrees. This embodiment is advantageous, because in another embodiment the tesseral shim coil comprises 4 times m saddle coils, wherein m is the order of the spherical harmonic being shimmed by the saddle coils as defined in equation 1. The azimuthal span of each saddle coil in this embodiment is limited to 90 divided by m degrees. This embodiment is advantageous because two shim channels can be combined into a single layer of a shim coil.

In another embodiment, the tesseral shim coil comprises a first and second set of saddle coils. The first and second set of saddle coils shim the same degree and order of the spherical harmonics of the magnetic field. The first set of saddle coils shim the spherical harmonics of the sine type of magnetic field and the second set of saddle coils shim the spherical harmonics of the cosine type magnetic field. This embodiment is advantageous, because the sine and cosine sets of saddle coils are complimentary and have a similar geometry. By limiting the azimuthal span both sets of saddle coils can be combined into a single layer. The term spherical harmonics of the sine type shim the $S_{nm}$ components and the term spherical harmonics of the cosine type refer to shims that shim the $C_{nm}$. When m=0, the $C_{nm}$ and $S_{nm}$ components drop out of equation 1. Shim coils which shim the spherical harmonics when m=0 are defined herein as zonal shim coils.

In another embodiment, the tesseral shim coil has an axis of symmetry. The saddle coils of the first type are axially symmetric with each other and the saddle coils of the second type are axially symmetric with each other. The saddle coils of the first type are distributed symmetrically above the axis of symmetry and the saddle coils of the second type are distributed symmetrically above the axis of symmetry. This embodiment is advantageous, because the coils are distributed symmetrically about the axis of symmetry and do not overlap each other. This allows a reduction of space when constructing a shim coil.

In another embodiment, the tesseral shim coil has an axis of symmetry and each saddle coil has a winding with an outer turn. The azimuthal span of the outer turn is equal to the azimuthal span of the tesseral shim coil. Each outer turn is located at the same radius from the axis of symmetry. This embodiment is advantageous, because the saddle coils do not overlap.

In another embodiment, the tesseral shim coil comprises one of the following: a combined ZX and ZY set of shim coils or a combination of the XY and X2-Y2 shim coils. This embodiment is advantageous because the ZX and ZY shim coils can be combined into a single layer under an embodiment of the invention and also because the XY and X2-Y2 shim coils are also complimentary and can be combined into a single layer according to an embodiment of the invention.

The ZX coil shims the C21 term, the ZY coil shims the S21 term, the X2-Y2 coil shims the C22 term, and the XY coil shims the S22 term.

In another embodiment, of the invention, the tesseral shim coil is integrated with a magnetic resonance imaging gradient coil. This embodiment has the advantage of saving radial space in the magnet.

In another embodiment, the tesseral shim coil is integrated with a magnetic resonance imaging radio frequency coil. This embodiment has the advantage of saving radial space in the magnet.

In another embodiment of the invention, the tesseral shim coil is integrated with a magnetic resonance imaging gradient coil and a magnetic resonance imaging radio frequency coil.

In another embodiment, the shim coil is cylindrical and the shim coil assembly is adapted for fitting into the bore of a cylindrical magnet. The shim coil assembly has a bore along its axis of symmetry adapted for receiving a subject and the shim coil assembly comprises at least one tesseral shim coil according to the embodiment of the invention. The shim coil assembly comprises a first cylindrical layer for each tesseral shim coil and the shim coil assembly further comprises a first electrical connection adapted for supplying current to each tesseral shim coil. The first electrical connection can be individual electrical connections for each saddle coil, or it can be a single electrical connection with multiple power feeds for the individual shim coils.

In another embodiment, the shim coil assembly further comprises at least one zonal shim coil assembly and the shim coil assembly further comprises a second cylindrical layer for the zonal shim coil. The shim coil assembly further comprises a second electrical connection adapted for supplying current to each zonal shim coil. The second electrical connection can be only for the zonal shim coil, or it can also be integrated with the first electrical connection. This embodiment is advantageous, because it is useful to integrate all the shim coils into a single assembly.

In another embodiment, the shim coil assembly comprises two cylindrical pieces and the shim coil assembly is adapted to be installed in a split magnetic resonance imaging system. This embodiment is advantageous, because magnetic resonance imaging systems are being used for guiding radiation therapy and charged particle beam therapy for treating cancer. Putting the shim coil assembly into two pieces allows the invention to be adapted to these types of magnetic resonance imaging systems.

In another aspect, the invention provides for a magnetic field shimming system for a magnetic resonance imaging system comprising a shim coil assembly according to an embodiment of the invention. The magnetic field shimming system further comprises a power supply for supplying electrical power to the shim coil assembly through a third electrical connection to each first electrical connection and each second electrical connection of the shim coil assembly. The third electrical connection is the power output of the power supply. The magnetic field shimming system further comprises a set of electrical cables adapted for connecting the third electrical connection to the first and second electrical connections. Again the first and second electrical connections can be the same electrical connection. The magnetic field shimming system further comprises a first control system adapted for controlling the electrical power supplied by the power supply. The control system can be a control system integrated into the power supply and receives general commands from a magnetic resonance imaging system, or the first control system can be a computer or a computer system. It is possible that a portion of the control system can be implemented on a computer system controlling a magnetic resonance imaging system.

In another aspect, the invention provides for a magnetic resonance imaging system adapted for acquiring magnetic resonance image data. The magnetic resonance imaging system comprises a magnetic field generation means for generating a magnetic field for orienting the magnetic spins of nuclei. The magnetic field generation means can be a permanent magnetic, an electromagnet, a superconducting electromagnet, or a combination of any of the three. The magnetic field generation means can be a cylindrical magnet with a bore adapted for receiving a patient, it can be a cylindrical split magnet adapted for receiving a patient in a bore or it can also be a so called open magnet. The open magnets have a more open design and resemble Helmholtz coils and allow freer access to the magnetic field. The magnetic resonance imaging system further comprises a magnetic field shimming system according to an embodiment of the invention. The magnetic resonance imaging system further comprises a radio frequency system for manipulating the orientation of atomic nuclei and receiving magnetic resonance imaging data. The radio frequency system for the magnetic resonance imaging system comprises an antenna or coil adapted for producing a perturbation to the magnetic field in an imaging region. This perturbation of magnetic field manipulates the orientation of the spin of the atomic nuclei. The atomic nuclei then emit a radio frequency signal which can be detected on a receive antenna or coil. The transmission and receive systems and coils and antennas can all be the same equipment also. Magnetic resonance imaging data is defined herein as measurement of the radio frequency signals emitted by the atomic nuclei. The magnetic resonance imaging data is used to reconstruct the magnetic resonance imaging images. The magnetic resonance imaging system further comprises a magnetic field gradient coil for spatial encoding of the orientation of the magnetic spins of the nuclei. The magnetic resonance imaging system further comprises a magnetic field gradient coil power supply for supplying current to the magnetic field gradient coil. This embodiment is advantageous, because the radial space used by the shim coils is reduced, allowing a larger region which can accommodate a subject. The magnetic resonance imaging system further comprises a second control system for reconstructing images from the magnetic resonance imaging data. The second control system is typically implemented on a computer or using a microcontroller with a computer program product. The second control system and the first control system can both be implemented on the same computer system or microcontroller system.

BRIEF DESCRIPTION OF THE DRAWINGS

In the following preferred embodiments of the invention will be described, by way of example only, and with reference to the drawings in which.

DETAILED DESCRIPTION

The numbering of elements is chosen such if that the two least significant digits of the numbering match then the element is either identical or performs the same function. Elements which have been discussed previously will not necessarily be discussed in description of later figures if the elements are identical or perform the same function.

Figure 1:
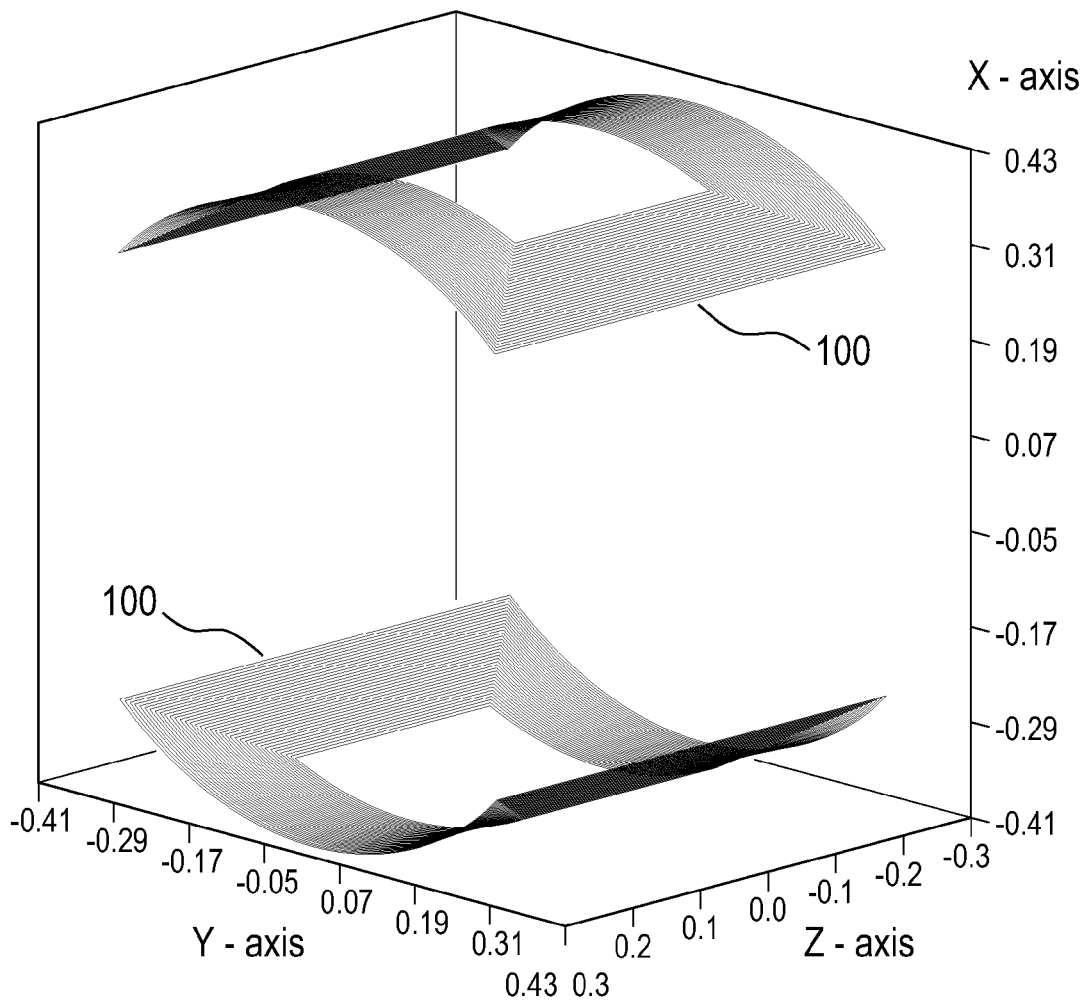
FIG. 1 shows an embodiment of a ZX shim coil according to an embodiment of the invention.

FIG. 1 shows the design of a ZX shim coil according to an embodiment of the invention. This saddle coils 100 comprising the ZX shim coil contains 36 turns extending azimuthally from 24 to 44 degrees. This is 34 degrees on average.

For evaluation of the merits of the design according to an embodiment of the invention the field coefficients for the coils shown in FIG. 1 is compared with that of a ZX saddles that contain 36 turns extending azimuthally from 49 to 71 degrees, that is 60 degrees average. Design A refers to the design that extends 60 degrees on average, and design B refers to the design shown in FIG. 1. For these calculations an input current of 122 Amps was the coils current used for design A and 191 Amps was the coils current used for design B.

TABLE 1 comparison of design A and design B. Field strength in units μT.

| field coefficient | Design A I = 122 A | Design B I = 191 A |
| --- | --- | --- |
| C21 | 2677.79 | 2678.70 |
| C41 | −359.79 | −336.31 |
| C43 | 24.11 | 375.60 |
| C61 | −74.68 | −80.16 |
| C63 | −9.52 | −2.68 |
| C65 | −31.23 | 20.84 |
| C81 | 42.61 | 41.45 |
| C83 | −0.17 | −17.57 |
| C85 | −2.06 | −1.19 |
| C87 | 3.99 | −6.62 |
| C10,1 | −8.22 | −7.29 |
| other | <1.46 | <4.72 |

Both design A and design B are intended to adjust the C21 field coefficient. Table 1 shows a comparison of the contamination of other field coefficients by these two coils.

As can be seen by the higher current required to drive design B, the sensitivity of design B is lower. However, the main characteristics of the field are preserved using design B: mainly C21 type field with approximately 13% C41 field contamination. This is comparable with design A. Only the contamination of the C43 term for design B is significantly worse than design A.

Note that with conventionally designed shim coils, there is overlap in azimuthal direction of a $C_{nm}$ shim coil with its associated $S_{nm}$ shim coil. Our invention avoids such overlap by limiting the azimuthal span of each individual saddle to less than 360/4 m degrees. So, for example, the individual saddles of the C21 coil may not occupy more than 360/4=90 degrees. This way, the $C_{nm}$ and the associated $S_{nm}$ don't have overlap and can be manufactured as a single layer.

Figure 2:
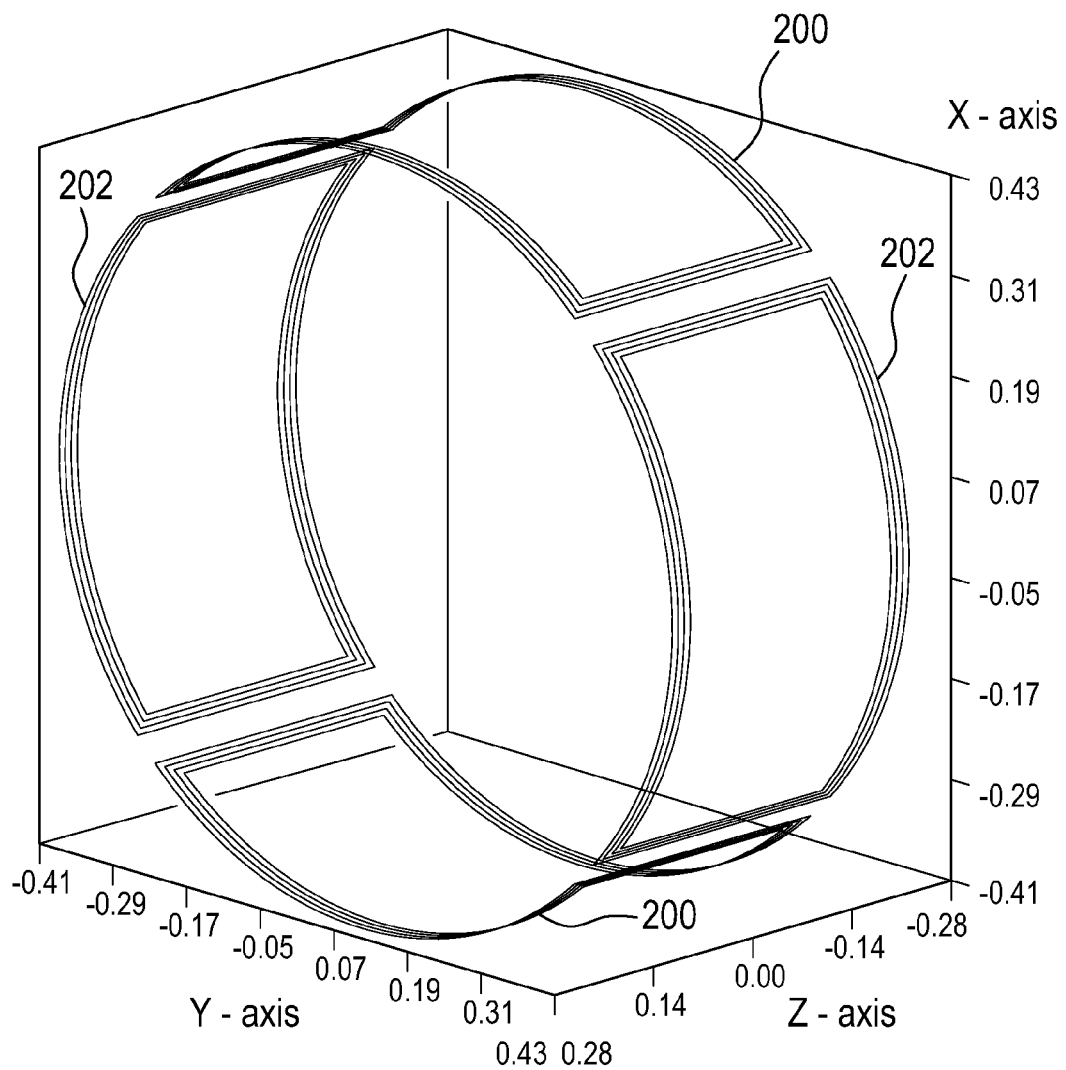
FIG. 2 shows an embodiment of a ZX and ZY tesseral shim coil according to an embodiment of the invention.

FIG. 2 shows a tesseral shimming coil according to an embodiment of the invention. This tesseral shimming coil comprises two saddle coils which comprise a ZX shim coil 200 and two saddle coils which comprise the ZY shim coils 202. From this figure it is clear that the shim coils have been integrated into a single layer.

Figure 3:
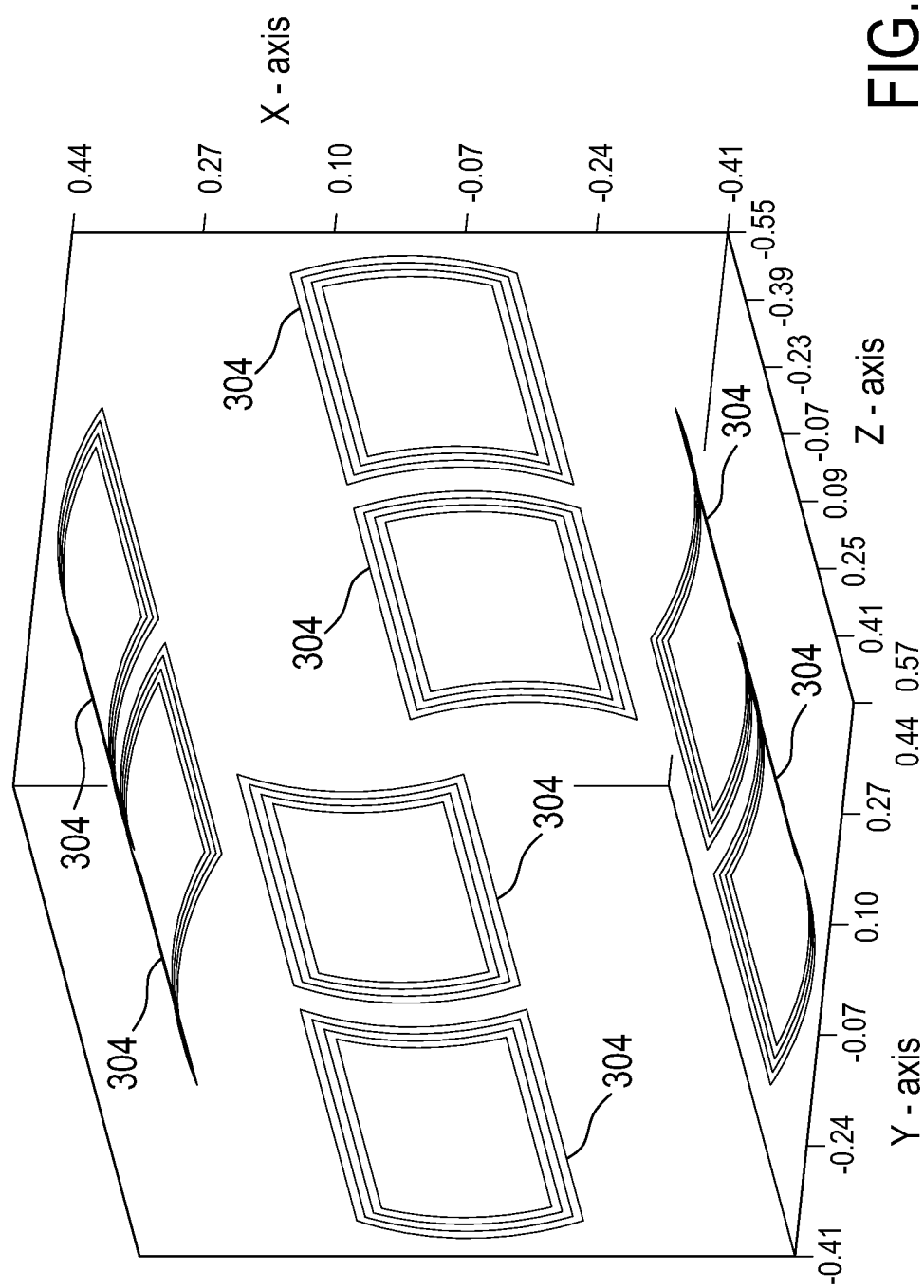
FIG. 3 shows a reduced angle at X2-Y2 shim coil according to an embodiment of the invention.

FIG. 3 shows a reduced angle at X2-Y2 shim coil. It is comprised of eight X2-Y2 saddle coils.

Figure 4:
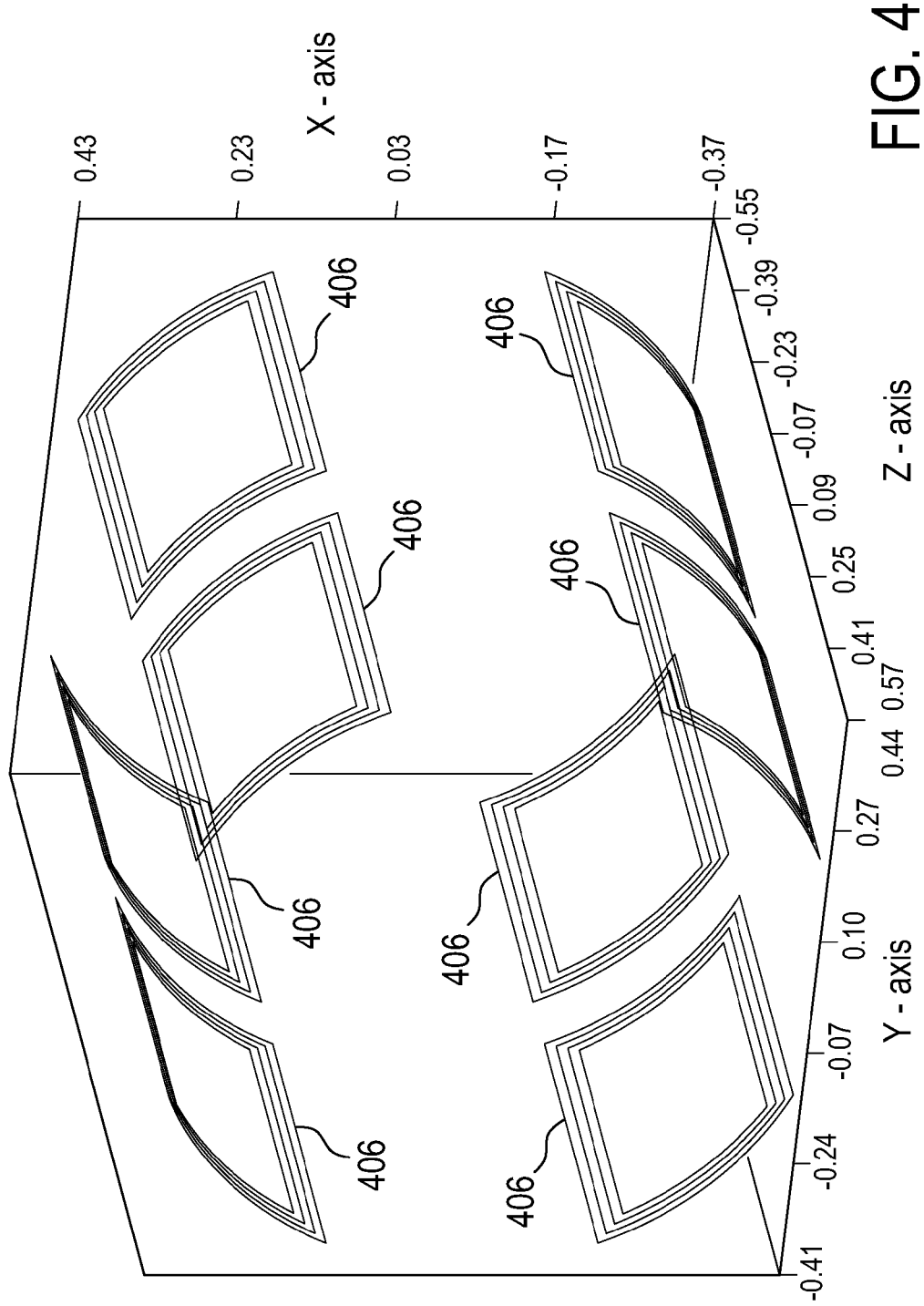
FIG. 4 shows a reduced angle XY shim coil according to an embodiment of the invention.

FIG. 4 shows a reduced angle XY shim coil according to an embodiment of the invention. The XY shim coil is comprised of eight XY saddle coils 406.

Figure 5:
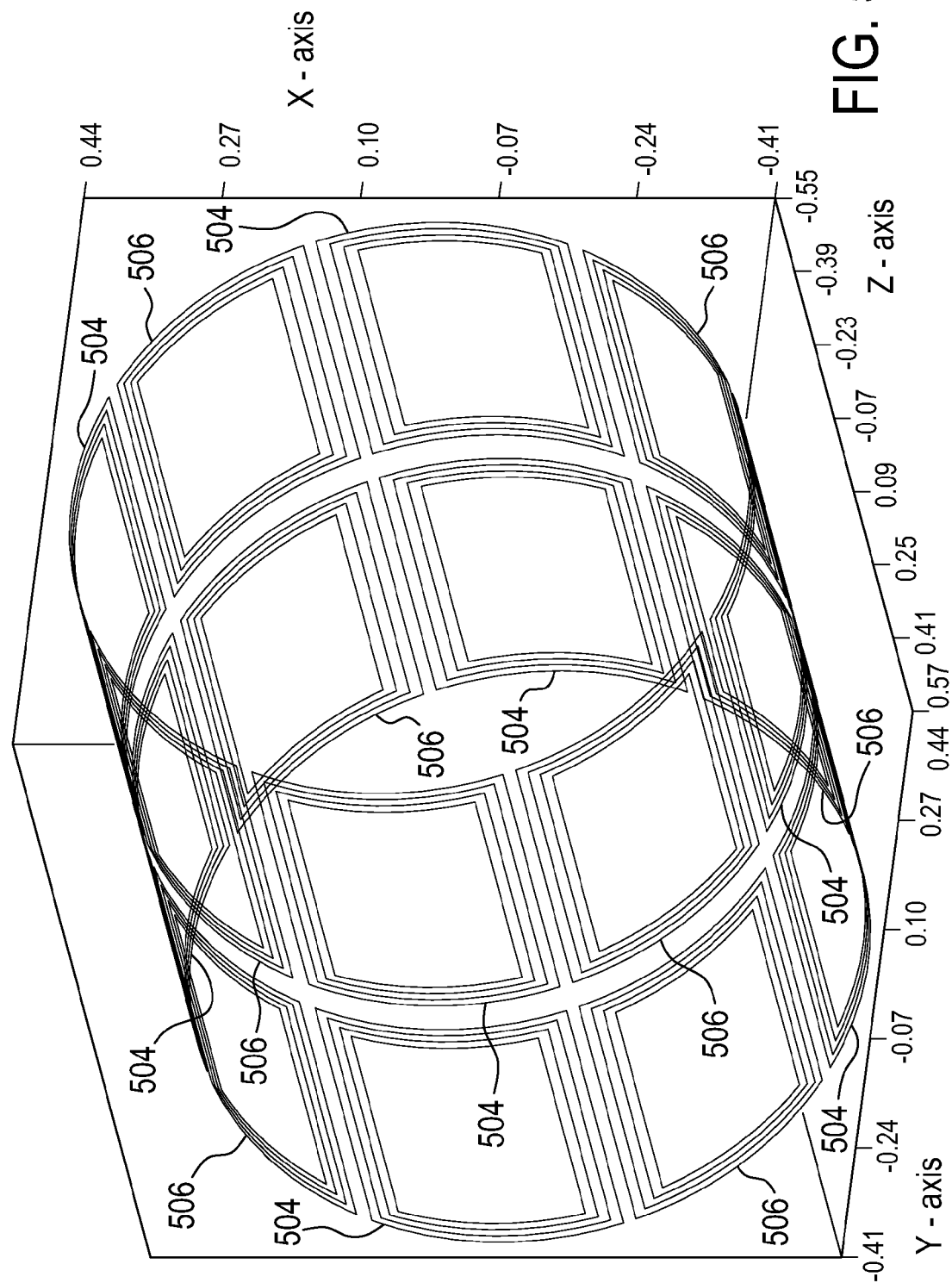
FIG. 5 shows the shim coils of FIG. 3 and FIG. 4 combined into a tesseral shim coil according to an embodiment of the invention.

FIG. 5 shows the shim coils of FIG. 3 and FIG. 4 combined into a tesseral shim coil according to an embodiment of the invention. The tesseral shim coil in FIG. 5 is able to shim the X2-Y2 and also the XY spherical harmonics. This tesseral is comprised of eight X2-Y2 saddle coils 504 and eight XY saddle coils 506. The saddle coils of type 504 and 506 do not overlap and from this figure it is clear that this tesseral shim coil can be manufactured in a single layer.

Figure 6:
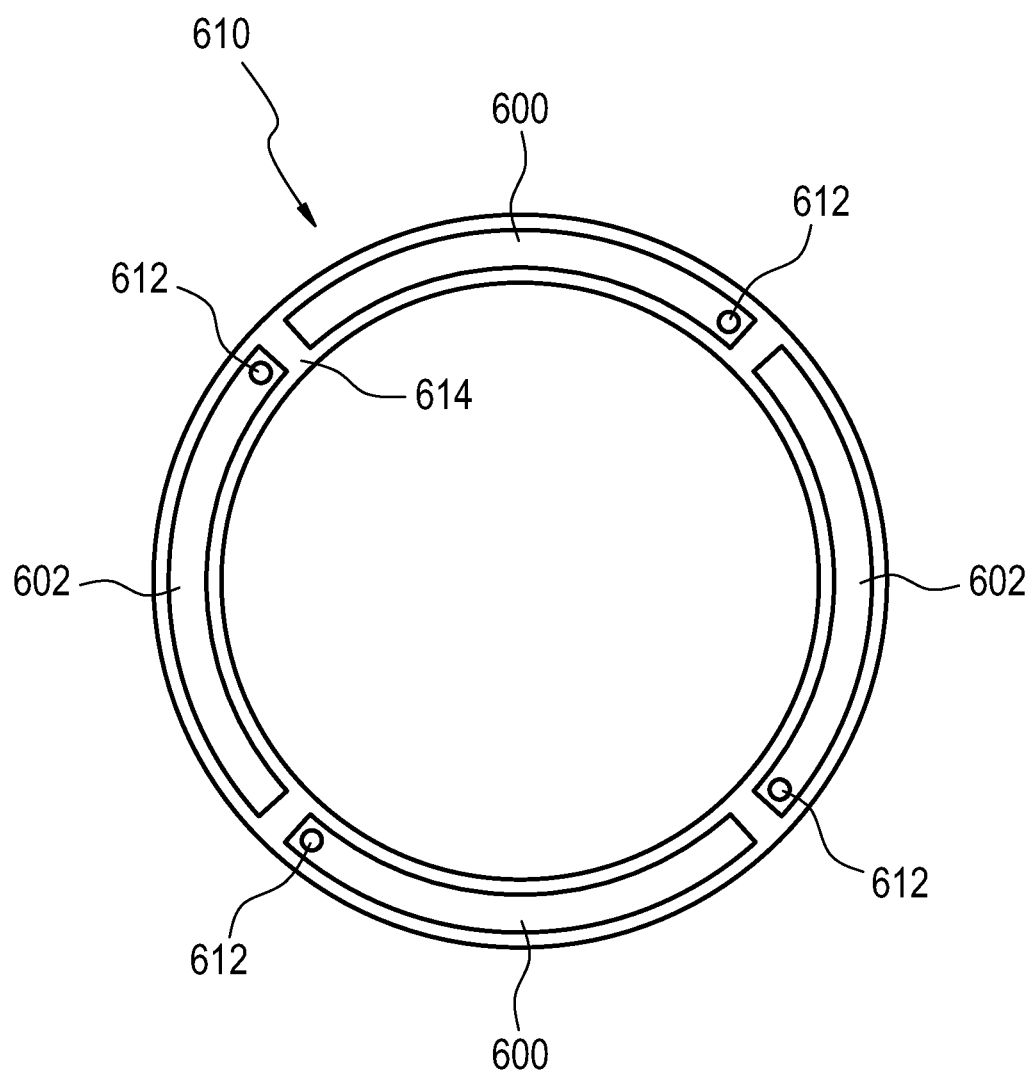
FIG. 6 shows a shim coil assembly according to an embodiment of the invention.

FIG. 6 shows a shim coil assembly 610 according to an embodiment of the invention. This shim coil assembly 610 is cylindrical and the view of FIG. 6 is a side view looking down the axis of symmetry. There is a cylindrical layer 614 which has ZX saddle coils 600 and ZY saddle coils 602 embedded in it. Each ZX saddle coil 600 and ZY saddle coil 602 has a first electrical connection 612. In this figure each saddle coil is shown as having its own electrical connection. In the other embodiment the number of electrical connections is reduced and the electrical connections go to a single connection.

Figure 7:
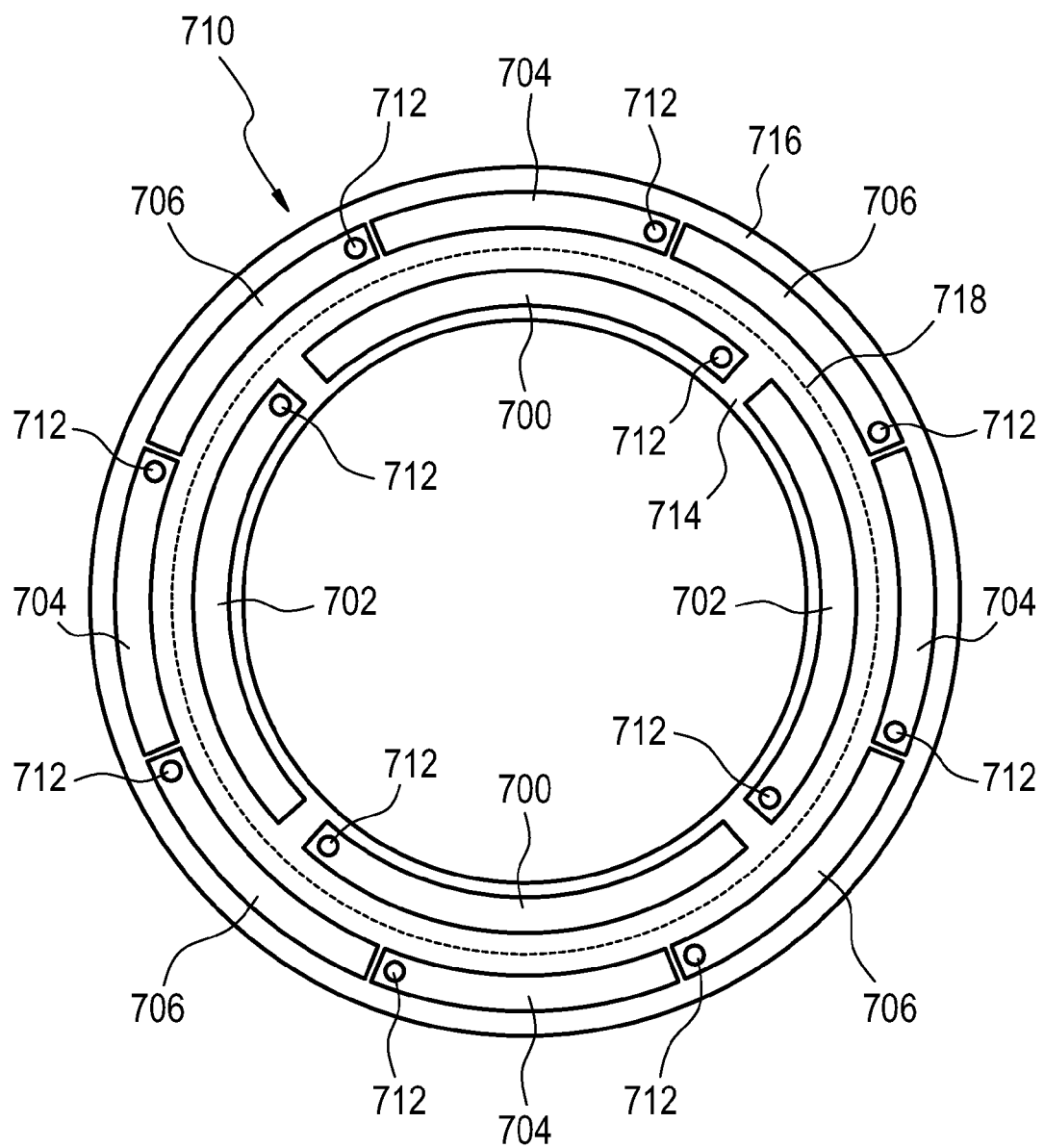
FIG. 7 shows a shim coil assembly according to an embodiment of the invention.

FIG. 7 shows a shim coil assembly 710 that is similar to the shim coil assembly 610 shown in FIG. 6. The difference in FIG. 7 is that there are two layers each containing a tesseral shim coil according to an embodiment of the invention. There is a first cylindrical layer which contains ZX saddle coil 700 and ZY saddle coils 702. This tesseral shim coil is located within the first cylindrical layer for ZX and ZY coils 714. There is also a first cylindrical layer for X2-Y2 and XY coils 716. Within this layer is contained X2-Y2 saddle coils 704 and XY saddle coils 706. Both of these first cylindrical layers are one assembly which comprises the shim coil assembly. There is a dotted line 718 which serves to conceptually divide the two first cylindrical layers. Notice FIG. 6 and FIG. 7 are not drawn to scale they are intended only to demonstrate the layout of saddle coils in a shim coil assembly.

Figure 8:
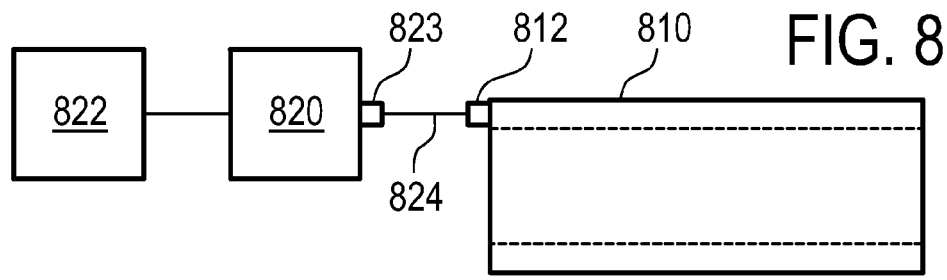
FIG. 8 shows a functional diagram of a magnetic field shimming system according to an embodiment of the invention.

FIG. 8 shows a magnetic field shimming system according to an embodiment of the invention. The magnetic field shimming system comprises a shim coil assembly 810. There is a first cylindrical connection 812 which connects the saddle coils located within the shim coil assembly 810 to electrical power. There is a set of electrical cables 824 which connect the first connection 812 to a power supply 820. The power supply 820 provides a current for the saddle coils in order to generate a magnetic field to shim the magnetic field of the magnetic resonance imaging system. The power supply 820 is connected to a first control system 822. The first control system 822 is adapted for controlling the operation of the power supply 820 in order to control the tesseral shim coils located within the shim coil assembly 810.

Figure 9:
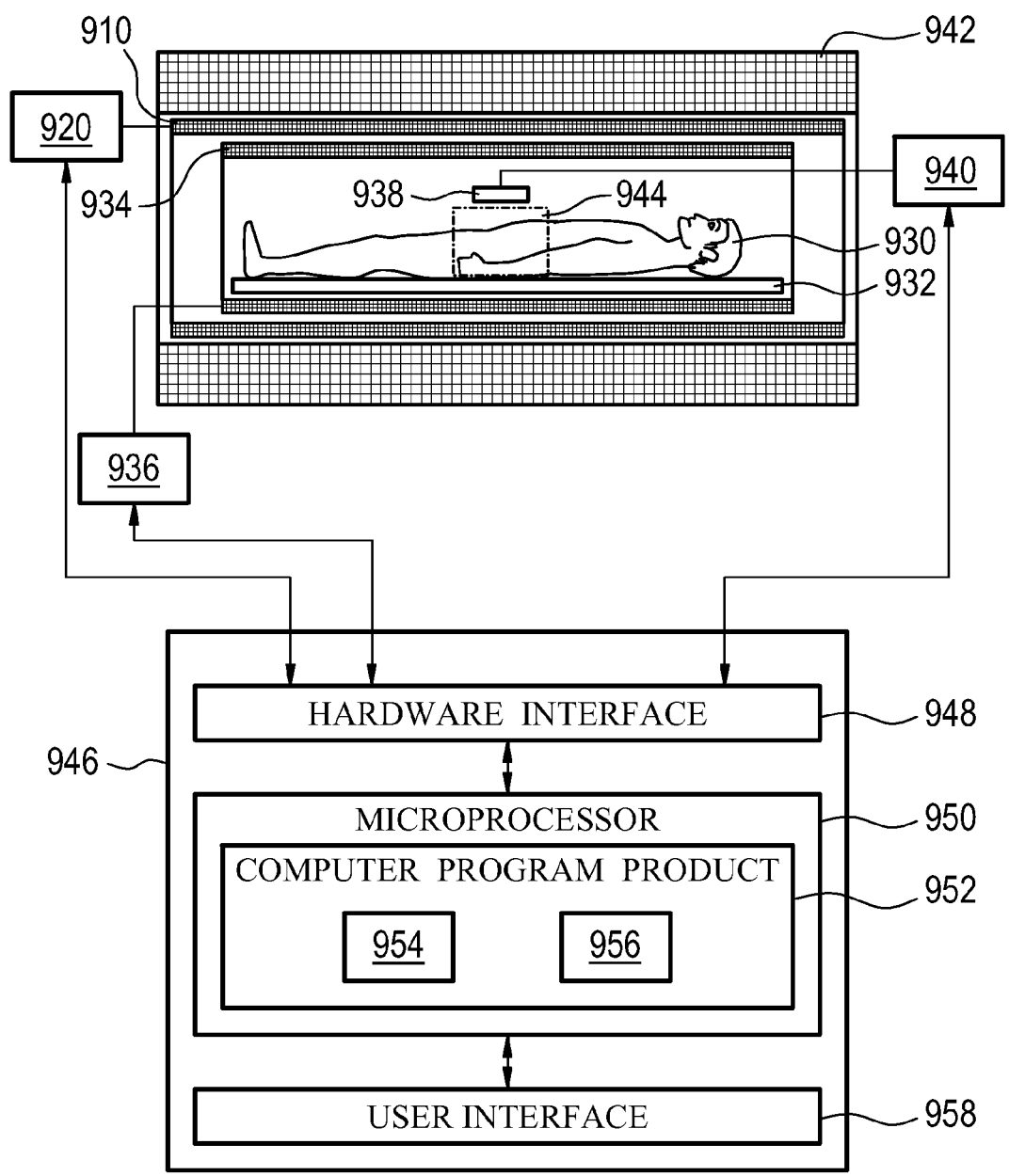
FIG. 9 shows a magnetic resonance imaging system according to an embodiment of the invention.

FIG. 9 shows an embodiment of a magnetic resonance imaging system according to an embodiment of the invention. There is a magnetic field generation means 942. The magnetic field generation means in this diagram shows a cylindrical type magnet with a bore adapted for receiving a subject 930. There is a subject 930 residing on a subject support 932 within the bore of the magnetic field generation means 942. The magnetic resonance imaging system is adapted for acquiring magnetic resonance imaging data in an imaging zone 944 within a subject 930. There is a shim coil assembly 910 according to an embodiment of the invention within the bore of the magnetic field generation means 942. The shim coil assembly 910 is powered by a power supply 920. Within the bore of the shim coil assembly 910 is shown a magnetic field gradient coil 934. The magnetic field gradient coil is powered by a magnetic field gradient coil power supply 936. For acquiring magnetic resonance imaging data, there is a radio frequency transceiver coil which is attached to a radio frequency transceiver 940. The power supply 920, the magnetic field gradient coil power supply 936, and the radio frequency transceiver 940 are all connected to a hardware interface 948 on a computer system 946. The hardware interface is connected to a microcontroller 950 which has a computer program product 952 for operating the magnetic resonance imaging system and also for constructing images from the magnetic resonance imaging data. The computer program product comprises an image reconstruction module 954 for constructing magnetic resonance imaging images from magnetic resonance imaging data. The computer program product 952 also comprises a shim coil control module 956. The shim coil control module comprises lookup tables and control algorithms necessary for controlling the power supply 920 for controlling the shimming of the magnetic field in the magnetic field means 942. There is a user interface 958 which is a part of the computer system 946. The user interface is adapted for receiving the input from a user in order to control the operation and function of the magnetic resonance imaging system.

LIST OF REFERENCE NUMERALS

100 ZX saddle coil
200 ZX saddle coil
202 ZY saddle coil
304 X2-Y2 saddle coil
406 XY saddle coil
504 X2-Y2 saddle coil
506 XY saddle coil
600 ZX saddle coil
602 ZY saddle coil
610 Shim coil assembly
612 First electrical connection
614 First cylindrical layer
700 ZX saddle coil
702 ZY saddle coil
704 X2-Y2 saddle coil
706 XY saddle coil
710 Shim coil assembly
712 First electrical connection
714 First cylindrical layer for ZX and ZY coils
716 First cylindrical layer for X2-Y2 and XY coils
718 Dotted line
810 Shim coil assembly
812 First electrical connection
820 Power supply
822 First control system
823 Third electrical connection
824 Set of electrical cables
910 Shim coil assembly
920 Power supply
930 Subject
932 Subject support
934 Magnetic field gradient coil
936 Magnetic field gradient coil power supply
938 Radio frequency transceiver coil
940 Radio frequency transceiver 942 Magnetic field generation means
944 Imaging zone
946 Computer system
948 Hardware interface
950 microprocessor
952 Computer program product
954 Image reconstruction module
956 Shim coil control module
958 User interface

The invention claimed is:

1. A tesseral shim coil for shimming the magnetic field of a magnetic resonance system by generating the spherical harmonics of the sine and cosine type of the magnetic field, the tesseral shim coil comprising: at least four saddle coils, wherein the sum of the azimuthal span of the at least four saddle coils is less than 360 degrees, the tesseral shim coil comprises a first and a second set of saddle coils distinct from the first set of saddle coils, wherein the first and second set of saddle coils shim the same degree and order of the spherical harmonics of the magnetic field, wherein the first set of saddle coils shim the spherical harmonic of the sine type of the magnetic field, wherein the second set of saddle coils shim the spherical harmonic of the cosine type of the magnetic field and the first and second sets of shim coils are combined into a single coil layer.

2. The tesseral shim coil of claim 1, wherein the tesseral shim coil comprises 4 times m saddle coils, where m is the order of the spherical harmonic being shimmed by the saddle coils, and wherein the azimuthal span of each saddle coil is limited to 90 divided by m degrees.

3. The tesseral shim coil of claim 2, wherein the tesseral shim coil has an axis of symmetry, wherein the saddle coils of the first type are axially symmetric with each other, wherein the saddle coils of the second type are axially symmetric with each other, wherein the saddle coils of the first type are distributed symmetrically about the axis of symmetry, and wherein the saddle coils of the second type are distributed symmetrically about the axis of symmetry and do not overlap each other.

4. The tesseral shim coil of claim 1, wherein the tesseral shim coil has an axis of symmetry, wherein each saddle coil has a winding with an outer turn, wherein the azimuthal span of the outer turn is equal to the azimuthal span of the tesseral shim coil, wherein each outer turn is located at the same radius from the axis of symmetry.

5. The tesseral shim coil of claim 1, wherein the tesseral shim coil comprises one of the following: (1) a combination of ZX and ZY shim coils in the single coil layer, and (2) a combination of XY and X2-Y2 shim coils in the single coil layer.

6. The tesseral shim coil of claim 1, wherein the tesseral shim coil is integrated with at least one of the following: a magnetic resonance imaging gradient coil and a magnetic resonance imaging radio frequency coil.

7. A shim coil assembly for a magnetic resonance imaging system, wherein the shim coil is cylindrical, wherein the shim coil assembly is adapted for fitting into the bore a cylindrical magnet, wherein the shim coil assembly has a bore along its axis of symmetry adapted for receiving a subject, the shim coil assembly comprises at least one tesseral shim coil according to claim 1, wherein the shim coil assembly comprises a first cylindrical layer for each tesseral shim coil, wherein the shim coil assembly further comprises a first electrical connection adapted for supplying current to each tesseral shim coil.

8. The shim coil assembly of claim 7, wherein the shim coil assembly further comprises at least one zonal shim coil assembly, wherein the shim coil assembly further comprises a second cylindrical layer for the zonal shim coil, and wherein the shim coil assembly further comprises a second electrical connection adapted for supplying current to each zonal shim coil.

9. The shim coil assembly of claim 7, wherein the shim coils assembly comprises two cylindrical pieces, and wherein the shim coil assembly is adapted to be installed in a split magnet magnetic resonance imaging system.

10. A magnetic field shimming system for a magnetic resonance imaging system comprising:
a shim coil assembly according to claim 8,
a power supply for supplying electrical power to the shim coil assembly via each first electrical connection and each second electrical connection of the shim coil assembly,
a set of electrical cables adapted for connecting the power supply to the first and second electrical connections,
a first control system adapted for controlling the electrical power supplied by the power supply.

11. A magnetic resonance imaging system adapted for acquiring magnetic resonance image data comprising:
a magnetic field generation means for generating a magnetic field for orientating the magnetic spins of nuclei,
a magnetic field shimming system according to claim 10,
a radio frequency system for manipulating the orientation of atomic nuclei and receiving magnetic resonance imaging data,
a magnetic field gradient coil for spatial encoding the orientation of the magnetic spins of nuclei,
a magnetic field gradient coil power supply for supplying current to the magnetic field gradient coil,
a second control system for reconstructing images from the magnetic resonance imaging data.

12. The tesseral shim coil of claim 1, wherein the first set of saddle coils are XY shim coils and the second set of saddle coils are X2-Y2 shim coils.

13. The tesseral shim coil of claim 1, wherein the first set of saddle coils are ZX shim coils and the second set of saddle coils are ZY shim coils.

14. The shim coil assembly of claim 7, wherein the first electrical connection is connected to all of the saddle coils of the first set of saddle coils.

15. The shim coil assembly of claim 7, wherein the first set of saddle coils are XY shim coils and the second set of saddle coils are X2-Y2 shim coils.

16. The shim coil assembly of claim 7, wherein the first set of saddle coils are ZX shim coils and the second set of saddle coils are ZY shim coils.

17. The magnetic resonance imaging system of claim 11, wherein the first set of saddle coils are XY shim coils and the second set of saddle coils are X2-Y2 shim coils.

18. The magnetic resonance imaging system of claim 11, wherein the power supply is connected to all of the XY shim coils via a single electrical connection.

19. The magnetic resonance imaging system of claim 11, wherein the first set of saddle coils are ZX shim coils and the second set of saddle coils are ZY shim coils.

20. The magnetic resonance imaging system of claim 11, wherein the power supply is connected to all of the ZX shim coils via a single electrical connection.

* * * * *